United States Patent
Noller

(10) Patent No.: US 8,933,640 B2
(45) Date of Patent: Jan. 13, 2015

(54) CIRCUITRY FOR CURRENT REGULATED, EXTERNALLY CONTROLLED LED DRIVING

(71) Applicant: Atmel Corporation, San Jose, CA (US)

(72) Inventor: Armin Noller, Grossbottwar (DE)

(73) Assignee: Atmel Corporation, San Jose, CA (US)

( * ) Notice: Subject to any disclaimer, the term of this patent is extended or adjusted under 35 U.S.C. 154(b) by 53 days.

(21) Appl. No.: 13/735,884

(22) Filed: Jan. 7, 2013

(65) Prior Publication Data

US 2014/0191681 A1   Jul. 10, 2014

(51) Int. Cl.
| | |
|---|---|
| G05F 1/00 | (2006.01) |
| H05B 37/02 | (2006.01) |
| H05B 39/04 | (2006.01) |
| H05B 41/36 | (2006.01) |
| H03K 3/00 | (2006.01) |
| H03K 17/00 | (2006.01) |

(52) U.S. Cl.
CPC .................. *H05B 37/02* (2013.01); *H03K 3/00* (2013.01); *H03K 17/00* (2013.01)
USPC .............................. 315/224; 315/223; 315/291

(58) Field of Classification Search
CPC ........... H05B 41/3925; H05B 41/2828; H05B 41/28; H05B 41/24; H05B 33/0815; H05B 33/0818; G05F 1/00; F02P 3/0884
USPC ........... 315/223, 224, 291, 200; 323/220–354
See application file for complete search history.

(56) References Cited

U.S. PATENT DOCUMENTS 7,528,555 B2 * 5/2009 Gater ............................ 315/291
8,344,656 B2 * 1/2013 Du et al. ....................... 315/297

* cited by examiner

*Primary Examiner* — Dylan White
(74) *Attorney, Agent, or Firm* — Fish & Richardson P.C.

(57) ABSTRACT

A current driver circuit for regulating a light emitting diode (LED) is disclosed. An example driver circuit uses one input node of the driver circuit for controlling both maximum brightness and dimming of an LED coupled to an output node of the driver circuit. The driver circuit supplies a reference voltage (VREF) to its input node. A microcontroller is coupled through a resistor or other resistive component to the input node of the driver circuit and provides the input current, where the input current is adjustable by the resistor value. The driver circuit is configured to drive multiple times the input current from its output node. By adjusting the resistor value the output current of the LED is adjusted. The microcontroller is configured to provide pulse width modulation (PWM). By reducing the duty cycle of the PWM waveform the dimming of the LED can be controlled.

15 Claims, 3 Drawing Sheets

CIRCUITRY FOR CURRENT REGULATED, EXTERNALLY CONTROLLED LED DRIVING

TECHNICAL FIELD

This disclosure relates generally to electronics and more specifically to the current control of light emitting devices, such as Light Emitting Diodes (LEDs).

BACKGROUND

LED lighting is used for many environments including closed environments like inside of a car. A current driver circuit is used to provide the current of the LED and control its brightness. Different colors of LEDs require different currents to provide the same brightness. Even LEDs of the same color require current adjustment to produce the same brightness. Delivering the same maximum brightness for the LEDs inside a small, closed environment is one task. The other task is providing control over the average current of the LEDs to give the LEDs the capability of being dimmed or brightened while their maximum brightness stays the same. The dimming is generally provided by turning the LED current on and off using pulse width modulation (PWM). The above two tasks are separate from each other and they are independently achieved.

SUMMARY

A circuitry for driving a controlled current is disclosed. An example current driver circuit includes an input node for receiving an input current and an output node for driving an output current and a current mirror (CM) module. The CM module is configured to receive a current at its input node and drive an output current that is multiple times the input current at its output node. The circuitry further includes a solid voltage (SV) module that is configured to receive a reference voltage (VREF). The SV module is coupled to the input node of the current driver circuit and provides the VREF as the voltage of the input node of the current driver circuit. The circuit also includes a current receiving module (CR) coupled to the SV module and coupled to the input node of the current driver circuit. The CR module is configured to receive the input current of the current driver circuit. The CM module is coupled to the CR module and receives the input current of the current driver circuit. The CM module is also coupled to the output node of the current driver circuit. The CM module drives an output current from the output node of the current driver circuit that is multiple times the input current of the current driver circuit.

The input current of the current driver circuit can be adjusted by coupling a resistor to the input node of the circuit from the first end of the resistor. The resistor or other resistive device can be coupled from the second end to a voltage source where the second end is supplied with a defined voltage. As an example, the resistor is coupled from the second end to the output node of a microcontroller. The input node of the current driver circuit has the constant voltage VREF. The input current of the current driver circuit is the difference of the supplied voltage of the voltage source and VREF divided by the value of the resistor. Therefore, the input current of the current driver circuit is adjustable by the resistor value. The output current of the current driver circuit that is multiple times the input current is also adjustable by the resistor value. The reference voltage (VREF) is a stable voltage and, as an example, is generated by the current driver circuit using a band-gap voltage reference. As an example, the current ratio between the input and output of the current driver circuit is between 10 and 1000 (e.g., 100). As another example, the current driver circuit is included in an integrated circuit chip and controls the lighting of a specific LED color while an external resistor is used for adjusting the current. Multiples of the same circuit are configured into an integrated circuit chip to provide the control for multiple LED colors.

In another aspect, an example circuit for regulating the current of an LED includes a microcontroller configured to generate PWM waveforms. The microcontroller is coupled through a resistor to the input node of a current driver circuit while an LED is coupled to the output node of the current driver circuit. The current driver circuit is configured to drive an input current it when the output voltage of the microcontroller is on (high). The current driver circuit is also configured to provide a reference voltage (VREF) at its input node. When the output voltage of the microcontroller is on, the input current it is the ratio of the difference between the microcontroller output voltage and VREF divided by the resistor value. Therefore, the input current it is adjustable by the resistor value. The current driver circuit is also configured to drive an output current from its output node that is multiple times its input current. The output current of the current driver circuit which is the same current drawn from the LED is also adjustable by the resistor value. Therefore, the maximum LED current is adjustable by the resistor value. When the output voltage of the microcontroller is off (low), no current flows to the input node of the current driver circuit and no current is driven from the output node of the current driver circuit or the LED. By modifying the duty cycle of the PWM waveform, the microcontroller can change the average current of the LED to modify the LED brightness and dim the LED. When the duty cycle of the PWM pulses is a hundred percent a constant current i1 is drawn at the input of the current driver circuit and a constant current that is multiple times i1 is drawn from the LED. Therefore, the maximum LED brightness is adjusted by the resistor value and dimming is controlled by the PWM waveform.

An example method is regulating an LED current by a circuit including a voltage source and a current driver circuit. The method includes generating a reference voltage (VREF) by the current driver circuit and applying the VREF to the input node of the current driver circuit. It includes receiving an input current by the input node of the current driver circuit where the input node is coupled through a resistor to the voltage supply and the input current is the difference of the supplied voltage to the resistor and the VREF divided by the resistor value. The method further includes driving an output current that is multiple times the input current from the output node of the current driver circuit and from the LED that is coupled to the output node of the current driver circuit and by changing the value of the resistor controlling the maximum current of the LED. The method also includes incorporating pulse width modulation (PWM) on the voltage source and controlling the average current of the LED. As an example, the voltage source is a microcontroller. As a further example, the current ratio between the input and output of the current driver circuit is between 10 and 1000 (e.g., 100).

Particular implementations that couple an adjustable resistor between the PWM output of the microcontroller and the input of the current driver circuit configure one node of the current driver circuit to integrate two requirements of the current driver: maximum brightness adjustment and dimming. When the PWM duty cycle is 100 percent, and the pulses are always on, the input and the output currents are constantly flowing and an LED coupled to the output of the current driver circuit is at its maximum brightness. The resistor value is adjusted to control the maximum brightness. When the microcontroller reduces the duty cycle of the PWM waveform, dimming occurs. Therefore, with this implementation, only one node is needed on the current driver circuit to maximum brightness adjustment and to adjust dimming. When the current driver circuit is implemented in an integrated chip then only one pin is required for both maximum brightness adjustment and dimming. Multiples of the same circuit can be integrated into an integrated circuit chip to provide control for multiple LED colors and only one pin per color is required.

DETAILED DESCRIPTION

Figure 1:
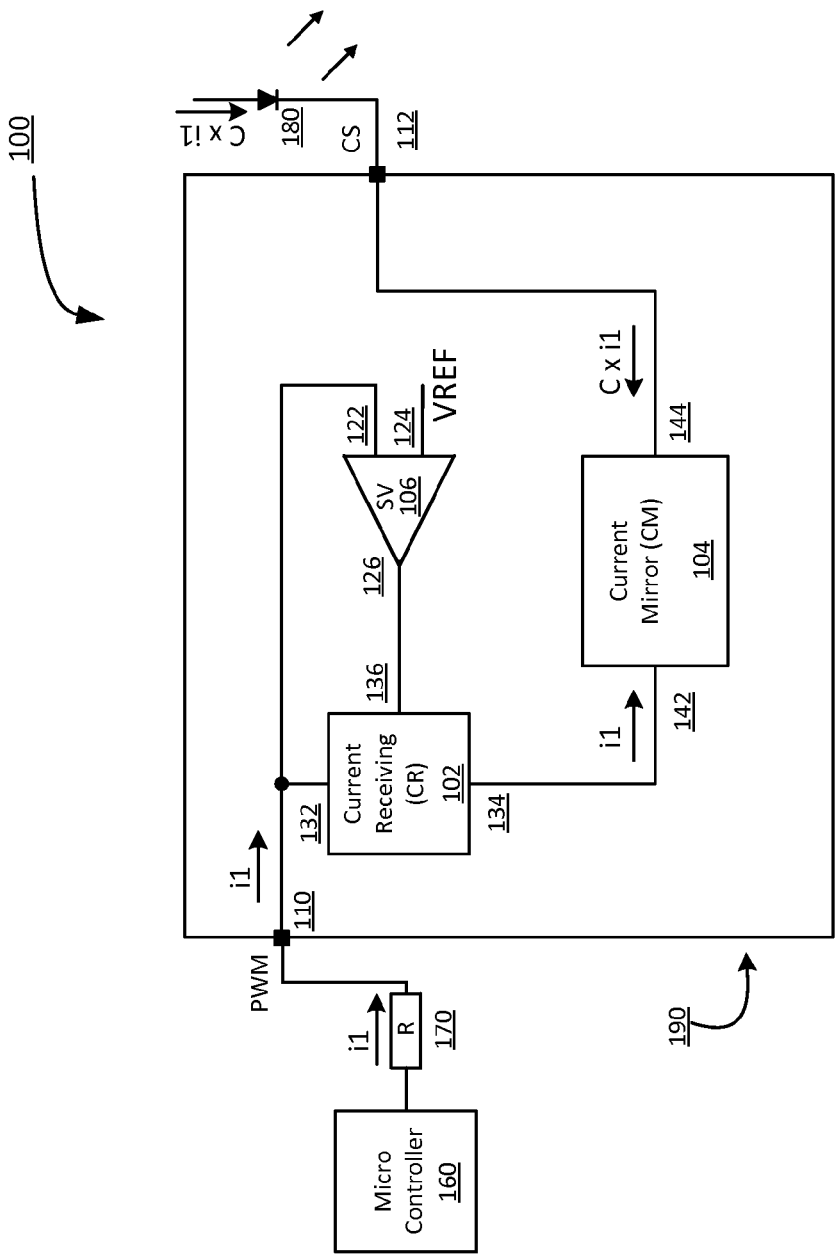
FIG. 1 is a circuit diagram of example current driver circuit.

FIG. 1 is an example circuit 100 including a current driver module 190 designed to generate the current for driving light emitting devices such as LEDs. The module 190 includes an input node 110 for receiving an input current (i1) and an output node 112 for driving an output current. The current driver module 190 includes a solid voltage (SV) module 106 that includes an input node 124 adapted to receive a stable reference voltage (VREF) and an input node 122 coupled to the input node 110 of the module 190. The module 190 also includes a current receiving (CR) module 102 having an input node 132 that is coupled to the input node 110 of the module 190 and an input node 136 that is coupled to the output node 126 of the SV module 106. The SV module is configured to draw substantially zero current at node 122 and to keep the voltages of its nodes 124 and 122 substantially equal. The SV module 106 is also configured to control the CR module 102 such that the module 102 receives the input current (i1) of the module 190 through its node 132 and to provide the current i1 at its output node 134. The SV module 106 having the reference voltage (VREF) at its input node 122, keeps VREF at the input node 110 of the module 190. The current driver module 190 also includes a current mirror (CM) module 104 having an input node 142 that is coupled to the output node 134 of the CR module 102 and an output node 144 that is coupled to the output node 112 of the module 190. The CM module 104 is configured to receive through its input node 142 the output current of CR module 102 and drive a current from its output node 144 that is multiple (C) times the received current. The output node 144 of the CM module 104 is coupled to the output 112 of the current driver module 190 and drives the same output current of the CM module from the output node 112 of the module 190.

The circuit 100 is used for brightness control of light emitting devices including LEDs. The module 190 includes an input node 110 that is set to a fixed voltage VREF and is configured to receive an input current. The module 190 includes an output node 112 that drives an output current that is multiple times the input current of module 190 and the same current is driven from a light emitting device such as an LED 180 that is coupled to it the output node 112. A voltage source such as a micro controller module 160 coupled through a resistive device such as a resistor 170 to the input node 110 of module 190 and provides the voltage for the resistor 170 to generate the input current i1. The module 190 is configured to have a fixed voltage VREF at its input node 110. The input current i1 is the difference of the output voltage of the voltage source 160 and VREF divided by the value of the resistor 170. Therefore, the input current as well as the output current of module 190 is adjustable by the resistor value. The brightness of the LED is modified if the voltage source 160 applies PWM. Setting the duty cycle of PWM pulses to 100 percent corresponds to the LED staying always on or the maximum brightness. Reducing the duty cycle causes the LED 180 to turn on and off and provide dimming capability. The circuit 100 controls the maximum brightness through selecting the value of the resistor 170 coupled to input node 110 of module 190. The circuit 100 also provides dimming by incorporating PWM on the output voltage of the voltage source 160 resulting in PWM on the current of the input node 110 (named PWM in FIG. 1) and controlling the average current of the LED 180. Therefore, from a single node 110 both maximum brightness and average brightness of the LED 180 is controlled. As an example the voltage source 160 is a microcontroller capable of producing PWM pulses. As another example the module 190 is incorporated into an integrated circuit and only one pin is used for controlling the maximum brightness and dimming. An integrated circuit including the module 190 provides current driver circuitry for one LED that controls maximum brightness as well as dimming. Additional such modules can be added to the chip to control multiple LEDs. As another example, based on LED type and color a resistor for each LED is selected such that all LEDs provide the same maximum brightness.

Figure 2:
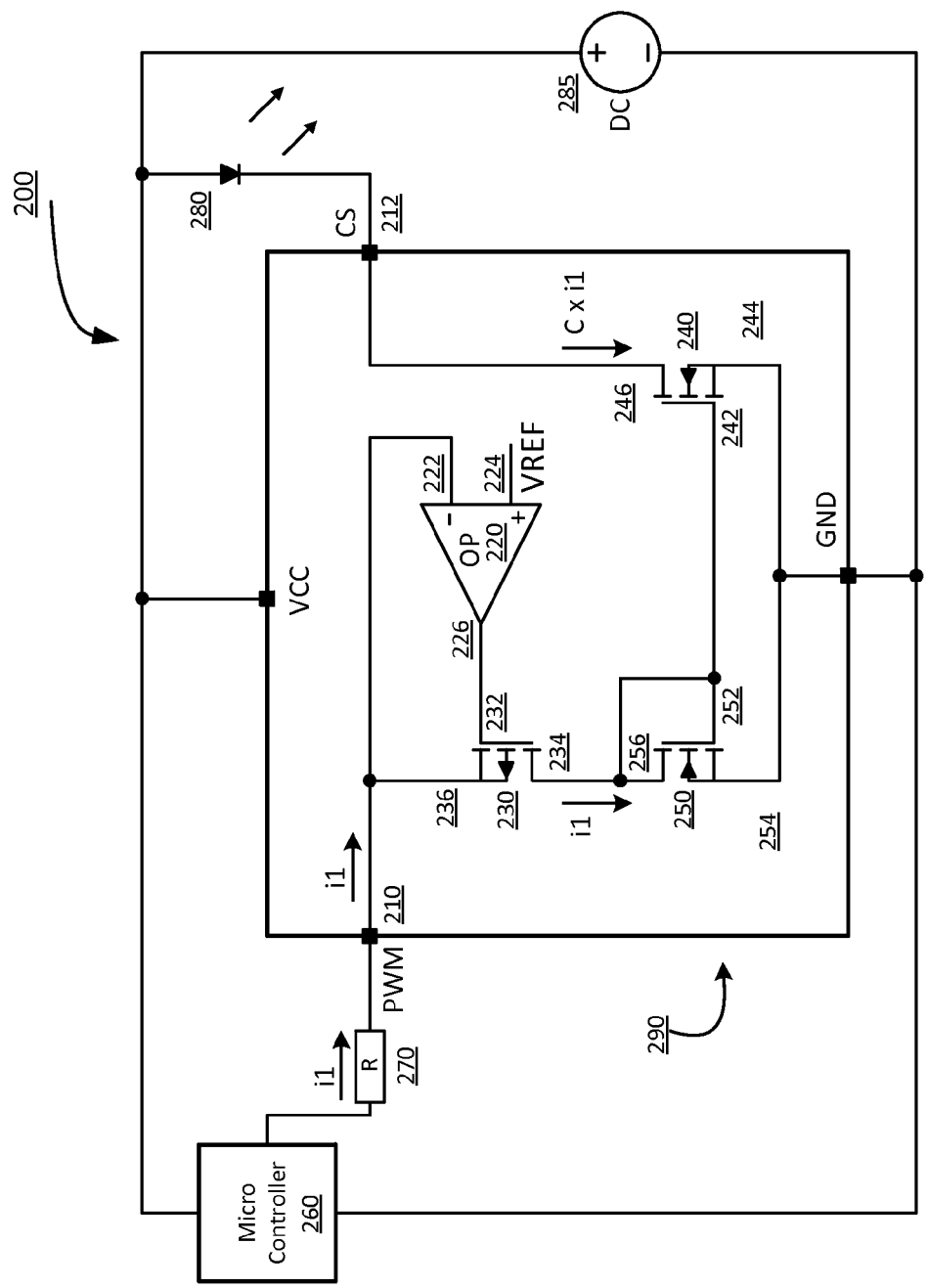
FIG. 2 is an example circuit diagram for regulating a light emitting diode.

FIG. 2 is an example current regulating circuit 200 for controlling LED lighting. The circuit 200 includes a current driver module 290 that includes an input (PWM) node 210 and an output node 212. The current driver module 290 is configured to receive an input current i1 from the node 210 and to drive multiple (C) times i1 from the node 212. The current driver 290 includes an operational amplifier 220 with its non-inverting node 224 coupled to a stable reference voltage (VREF) and its inverting node 222 coupled to the input node of the current driver module 290. The output node 226 of the operational amplifier 220 is coupled to the gate node 232 a p-type MOSFET 230. The operational amplifier 220 is configured to operate such that module 220 drives substantially zero current from its node 222 and module 220 keeps the voltages of its nodes 224 and 222 substantially equal. Thus, the module 220 holds the same reference voltage (VREF) of the non-inverting node 224 at the inverting node 222. The module MOSFET 230 is configured to drive the input current i1 from its source node 236 and pass it to its drain node 234. The voltage VREF is required to remain stable. As an example, VREF is built in the module 290. As another example, VREF is a band-gap voltage reference.

Two back to back N-type MOSFETs 240 and 250 inside the current driver module 290 provide a current mirror. The N-type MOSFET 250 has its drain node 256 coupled to the drain node 234 of MOSFET 230 and receives the input current i1. The gate node 252 and drain node 256 of MOSFET 250 are coupled together and further coupled to the gate node 242 of MOSFET 240. The source nodes 254 and 244 of the two N-type MOSFETs are also coupled together. The MOSFETs 240 and 250 are similarly biased and similar currents pass through their drains. The module 290 is configured to incorporate a MOSFET 240 having a similar design but larger dimensions compared to MOSFET 250 and therefore MOSFET 240 draws a larger current proportional to i1 by its drain 246. The ratio of the currents passing through the drains 256 and 246 of the two MOSFETs is the ratio of their design dimensions. As an example the current driver module 290 is incorporated in an integrated circuit chip with the MOSFETs 240 and 250 having the same design but MOSFET 240 having dimensions multiple times the dimensions of MOSFET 250 and making the drain current of MOSFET 240 multiple times the drain current of MOSFET 250. The example module 290 when incorporated in a chip includes an input node with a fixed voltage VREF where the input node drives an input current and further includes an output node that drives an output current where the output current is multiple times the input current.

The current driver module 290 of circuit 200 is coupled from its output node 212 to an LED 280 and the same output current of current driver module 290 passes through the LED. The LED is coupled to a DC voltage source 285. An output node of a microcontroller 260 is coupled through a resistor 270 to the input node 210 of the current driver module. The input current to the node 210 of the current driver module is a difference of the microcontroller output and the reference voltage (VREF) divided by the value of the resistor 270. The input current is adjustable by the value of the resistor and the output current through the node 212 being multiple times the input current is also adjustable. Therefore, by adjusting the value of the resistor 270 the current passing through the LED 280 is modified.

The example configuration of circuit 200 is used for brightness control of a single LED color. Incorporating three of the current driver modules 290 on the same chip, the brightness of all primary color LEDs are controlled. Depending on color or manufacturing, the LEDs generate different brightness when driven by the same current. The resistor of circuit 200 is used for adjusting the maximum brightness. The dimming of the LEDs is achieved by incorporating PWM on the output voltage of the microcontroller 260 causing the current pulses that are sent to the input node 210 of the current driver module 290 showing PWM. By changing the duty cycle of the PWM pulses the average current of the LED and the brightness of the LEDs is modified through the same input node 210. Therefore, from a single node 210 of current driver module 290 both maximum brightness and average brightness of the LED is controlled.

The circuit 200 and its module 290 incorporate one circuit node or one pin if module 290 is incorporated on a chip to regulate both maximum current and dimming of an LED. In this configuration the current driven by the module 290 is much smaller than the LED current and the output of the voltage source 260 is not loaded. As another example, based on LED type and color a resistor for each LED is selected and the circuit is assembled such that all LEDs provide the same maximum brightness.

Figure 3:
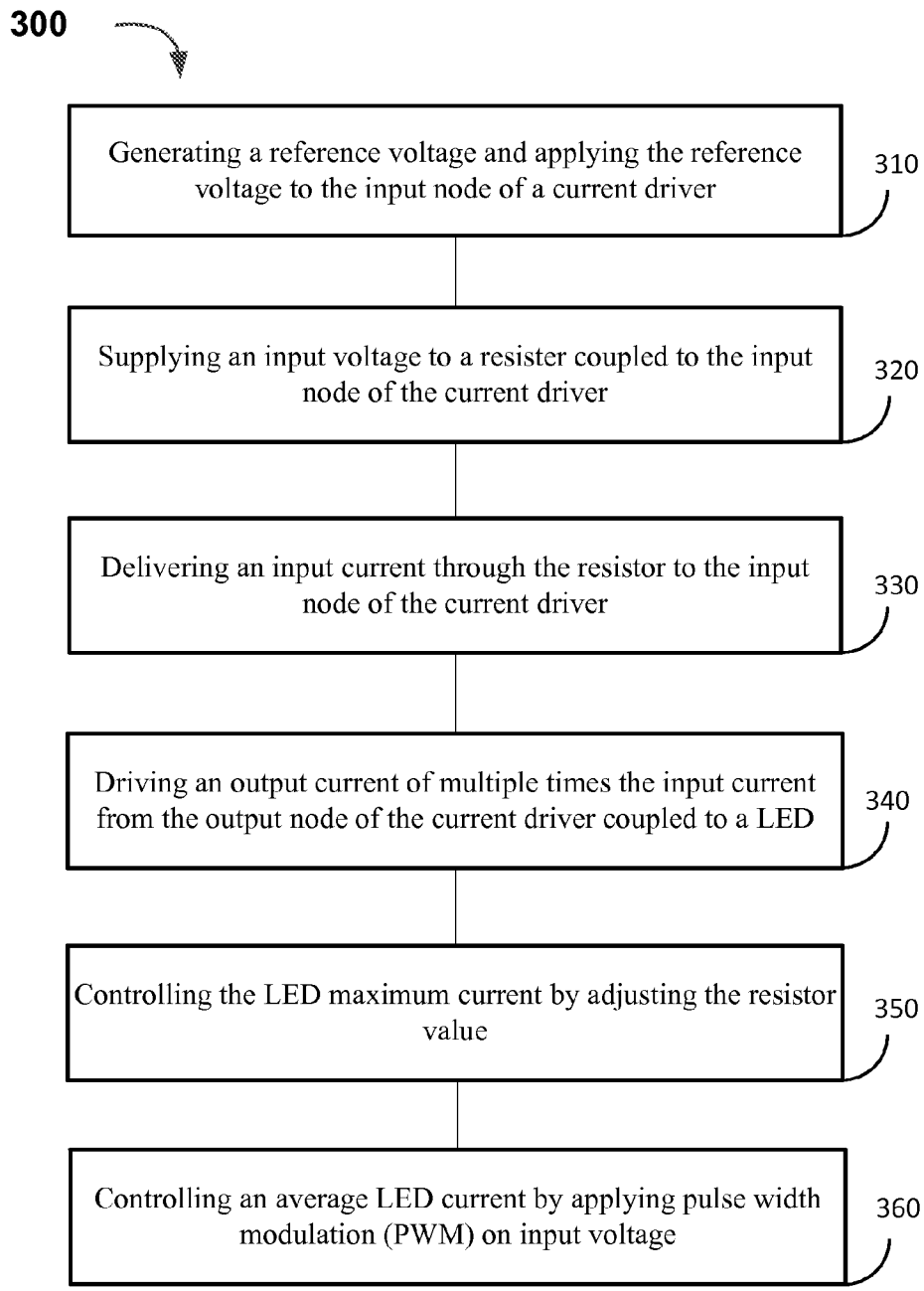
FIG. 3 is an example flow diagram of a method for regulating a light emitting diode.

FIG. 3 is a flow diagram of process 300 implemented on circuit 200 of FIG. 2 that includes a current driver module 290 intended for regulating the current of an LED. A reference voltage (VREF) is generated and applied to the input node of the current driver in step 310. Supplying an input voltage to a resistor coupled to the input node of the current driver is performed in step 320. An input current is delivered through the resistor to the input node of the current driver in step 330. In step 340, an output current of multiple times the input current is driven from the output of the current driver coupled to an LED. The maximum LED current is controlled in step 350 by adjusting the resistor value. In step 360, the average LED current is controlled by applying pulse width modulation on the input voltage.

what is claimed is:

1. A current driver circuit comprising:
an input node adapted to receive an input current;
an output node adapted to drive an output current;
a solid voltage module having a first input coupled to a reference voltage and a second input coupled to the input node, the solid voltage module including an operational amplifier having a non-inverting node coupled to the reference voltage and an inverting node coupled to the input node, the operational amplifier configured to have a voltage of the inverting node the same as the reference voltage;
a current receiving module coupled to an output of the solid voltage module and the input node, the current receiving module configured to drive the input current from the input node; and
a current mirror module coupled to the current receiving module and the output node and configured to receive the input current from the current receiving module and drive an output current from the output node that is multiple times the input current.

2. The circuit of claim 1, wherein the input node is coupled to a first end of a resistor and a driving voltage is coupled to a second end of the resistor, and wherein the input current is a difference of the driving voltage and the reference voltage divided by a resistor value.

3. The circuit of claim 2, wherein the current receiving module includes a first transistor, wherein the first transistor is configured to drive the input current from the input node.

4. The circuit of claim 3, wherein the current mirror module includes a second transistor coupled to the first transistor and coupled back to back to a third transistor, wherein the second transistor is configured to receive the input current and the third transistor is configured to drive the output current.

5. The circuit of claim 2, wherein the driving voltage is supplied by a microcontroller configured to use pulse width modulation (PWM) to control an average output current of the circuit.

6. The circuit of claim 2, wherein the resistor value is configured to control the input current and the output current of the circuit.

7. The circuit of claim 2, wherein the output node is coupled to a light emitting diode (LED).

8. The circuit of claim 7, wherein the circuit is configured to control a specific LED color and the circuit further includes one or more drivers configured to control one or more LED colors.

9. The circuit of claim 1, wherein the circuit is included in an integrated circuit incorporated in a chip.

10. The circuit of claim 1, wherein the output current is between 10 and 1000 times greater than the input current.

11. The circuit of claim 1, wherein the reference voltage is a band-gap voltage reference.

12. A circuit configured for current regulating of a light emitting diode (LED), the circuit comprising:
a microcontroller configured to generate an output voltage, wherein the output voltage of the microcontroller is configured to incorporate pulse width modulation (PWM);
a current driver including an input node and an output node and configured to receive an input current and to drive an output current, wherein the output current is multiple times the input current, and wherein a reference voltage is supplied at the input node of the current driver, where the current driver includes:
a solid voltage module having a first input coupled to the reference voltage and a second input coupled to the input node, the solid voltage module including an operational amplifier having a non-inverting node coupled to the reference voltage and an inverting node coupled to the input node, the operational amplifier configured to have a voltage of the inverting node the same as the reference voltage;

a current receiving module coupled to an output of the solid voltage module and the input node, the current receiving module configured to drive the input current from the input node; and a current mirror module coupled to the current receiving module and the output node and configured to receive the input current from the current receiving module and drive an output current from the output node that is multiple times the input current;

a resistor coupled to the output voltage of the microcontroller from a first end and to the input node of the current driver from a second end, wherein the input current is a difference of the output voltage of the microcontroller and the reference voltage divided by a resistor value; and an LED coupled to the output node of the current driver, wherein the current driver is configured to drive the output current from the LED, the resistor value controls a maximum current of the LED, and an average current of the LED is adjusted by the PWM.

13. The circuit of claim 12, wherein the microcontroller is configured to change a duty cycle of the PWM waveform and control a brightness of the LED.

14. The circuit of claim 12, wherein the output current of the current driver is at least 10 times the input current of the current driver.

15. The circuit of claim 12, wherein the reference voltage is a band-gap voltage reference.

* * * * *